(12) United States Patent
Ohashi

(10) Patent No.: US 10,911,030 B2
(45) Date of Patent: Feb. 2, 2021

(54) DRIVE CIRCUIT FOR POWER ELEMENT

(71) Applicant: FUJI ELECTRIC CO., LTD., Kawasaki (JP)

(72) Inventor: Hidetomo Ohashi, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 214 days.

(21) Appl. No.: 16/119,290

(22) Filed: Aug. 31, 2018

(65) Prior Publication Data

US 2018/0375499 A1    Dec. 27, 2018

Related U.S. Application Data

(63) Continuation-in-part of application No. PCT/JP2017/028656, filed on Aug. 8, 2017.

(30) Foreign Application Priority Data

Sep. 9, 2016    (JP) .................................. 2016-176892

(51) Int. Cl.
  *H03K 3/012* (2006.01)
  *H03K 17/0412* (2006.01)
  *H03K 17/082* (2006.01)

(52) U.S. Cl.
  CPC ......... *H03K 3/012* (2013.01); *H03K 17/0412* (2013.01); *H03K 17/0822* (2013.01); *H03K 17/0828* (2013.01); *H03K 2217/0036* (2013.01)

(58) Field of Classification Search
  CPC ............... H03K 3/012; H03K 17/0412; H03K 17/0822; H03K 17/0828; H03K 2217/0036; H02M 1/08
  See application file for complete search history.

(56) References Cited

U.S. PATENT DOCUMENTS

| 8,258,823 B2 | 9/2012 | Prior et al. |
| 2009/0058499 A1 | 3/2009 | Yamashiro et al. |

(Continued)

FOREIGN PATENT DOCUMENTS

| JP | 11-97994 A | 4/1999 |
| JP | 2009-55696 A | 3/2009 |

(Continued)

OTHER PUBLICATIONS

International Search Report dated Nov. 7, 2017, in corresponding International Patent Application No. PCT/JP2017/028656.

(Continued)

*Primary Examiner* — Gary L Laxton

(57) ABSTRACT

There is provided a drive circuit for turning on/off a power element which controls a main current flow between a first main electrode and a second main electrode in response to a drive signal applied to a control electrode. The drive circuit includes first and second semiconductor switch elements which are connected in series and interposed between a power supply terminal and a ground terminal, a series connection point thereof being connected to the control electrode, third and fourth semiconductor switch elements which are connected in series and interposed between the power supply terminal and the ground terminal, a series connection point thereof being connected to the second main electrode, and a control circuit which controls turn-on/off of the power element by turning on/off the first to fourth semiconductor switch elements. The first semiconductor switch element has a larger on-resistance than the second to fourth semiconductor switch elements.

9 Claims, 7 Drawing Sheets

(56) References Cited

U.S. PATENT DOCUMENTS

| | | | |
|---|---|---|---|
| 2010/0141304 A1 | 6/2010 | Miyazaki | |
| 2014/0097876 A1* | 4/2014 | Yamashiro | H03K 3/012 |
| | | | 327/109 |
| 2015/0200661 A1* | 7/2015 | Jeon | H03K 17/162 |
| | | | 327/109 |
| 2015/0349776 A1* | 12/2015 | Abouda | H03K 19/017509 |
| | | | 327/109 |
| 2016/0173094 A1* | 6/2016 | Choi | H03K 17/08128 |
| | | | 327/109 |

FOREIGN PATENT DOCUMENTS

| | | |
|---|---|---|
| JP | 5011585 B2 | 8/2012 |
| JP | 2015-32984 A | 2/2015 |
| WO | 2009/004715 A1 | 1/2009 |

OTHER PUBLICATIONS

Written Opinion dated Nov. 7, 2017, in corresponding International Patent Application No. PCT/JP2017/028656.
Japanese Office Action dated Dec. 3, 2019 in corresponding Japanese Patent Application No. 2018-538317.

\* cited by examiner

DRIVE CIRCUIT FOR POWER ELEMENT

CROSS-REFERENCE TO RELATED APPLICATIONS

This is a Continuation-in-Part of International Patent Application No. PCT/JP2017/028656 filed Aug. 8, 2017, which claims the benefit of Japanese Patent Application No. 2016-1765892 filed Sep. 9, 2016. The disclosures of the prior applications are hereby incorporated by reference herein in their entireties.

TECHNICAL FIELD

The present invention relates to a drive circuit which turns on/off a power element such as an IGBT and, in particular, relates to the drive circuit for the power element having a simple configuration in which a switching loss of the power element is reduced.

BACKGROUND ART

FIG. 6 is a schematic configuration diagram showing an example of a drive circuit 1 of a related art which turns on/off a power element 2 such as an IGBT. The drive circuit 1 plays a role of turning on/off a drive signal applied to the gate of the IGBT (power element) 2 and controlling a main current flow between the collector and the emitter of the IGBT 2. A current Ic supplied to a load (RL) connected between a main power supply 3 and the IGBT 2 is controlled in accordance with the on/off of the IGBT 2.

Schematically, the drive circuit 1 includes first and second semiconductor switch elements Q1, Q2, which are connected in series and interposed between a power supply terminal (Vcc) of a power supply 4 and a ground terminal (GND), and third and fourth semiconductor switch elements Q3, Q4, which are connected in series and interposed between the power supply terminal (Vcc) of the power supply 4 and the ground terminal (GND). The first and second semiconductor switch elements are connected in parallel to the third and fourth semiconductor switch elements. A series connection point (node P1) of the first and second semiconductor switch elements Q1, Q2 connected to the gate of the IGBT 2 via a gate resistor RG. A series connection point (node P2) of the third and fourth semiconductor switch elements Q3, Q4 is connected to the emitter of the IGBT 2.

The first to fourth semiconductor switch elements Q1, Q2, Q3, Q4 are each formed of, for example, an MOS-FET and constitute a switch matrix circuit in which the first to fourth semiconductor switch elements are turned on/off in association with one another under the control of a control circuit 5, thereby turning the IGBT 2 on/off. The control circuit 5 plays a role of turning on/off the first to fourth semiconductor switch elements Q1, Q2, Q3, Q4 in association with one another in accordance with a control signal SG supplied from the outside, thereby controlling on/off of the IGBT 2.

FIG. 7 shows operation timings which represent state changes in respective portions of the drive circuit 1 according to the control signal SG and voltage changes in the IGBT 2. In FIG. 7, V (P1) represents the voltage change in the node P1. V(E) represents the voltage change in the emitter (node P2) of the IGBT 2, V(G) represents the voltage change in the gate of the IGBT 2, and Vge represents the voltage change between the gate and the emitter of the IGBT 2.

As shown in FIG. 7, the drive circuit 1 positively or negatively biases the gate emitter voltage Vge of the IGBT 2 according to the control signal SG, thereby turning the IGBT 2 on/off. That is, the drive circuit 1 turns on each of the first and fourth semiconductor switch elements Q1, Q4, and turns off the second and third semiconductor switch elements Q2, Q3, thereby setting the voltage of the node P1 to a power supply voltage Vcc of the power supply 4 and grounding the emitter of the IGBT 2. Thus, the drive circuit 1 applies the voltage (power supply voltage Vcc) of the node P1 to the gate of the IGBT 2 via the gate resistor RG and so turns the IGBT 2 on.

The drive circuit 1 turns off the first and fourth semiconductor switch elements Q1, Q4, and turns on the second and third semiconductor switch elements Q2, Q3, thereby grounding the node P1 and setting the emitter voltage of the IGBT 2 to the power supply voltage Vcc of the power supply 4. Thus, the drive circuit 1 grounds the gate of the IGBT 2 via the gate resistor RG and so turns the IGBT 2 off. The drive circuit 1 configured in this manner is described in detail in, for example, Patent document 1.

PRIOR ART DOCUMENT

Patent Document

Patent Document 1: Japanese Patent No. 5011585

SUMMARY OF THE INVENTION

Problem to be Solved by the Invention

The drive circuit 1 disclosed in Patent Document 1 can turn the IGBT 2 on/off by positively or negatively biasing the IGBT 2 using only the positive power supply voltage Vcc which is outputted from the power supply 4. Thus, this drive circuit is superior in terms of not requiring a negative power supply. However, the drive circuit 1 of the related art is configured to apply the voltage V(P1) of the node P1 to the gate of the IGBT 2 via the gate resistor RG, thereby charging/discharging the gate capacitor of the IGBT 2. Accordingly, there arises the defect that a switching loss at the turn-on and off times of the IGBT 2 is large.

In this respect, Patent Document 1 discloses that the switching loss at the turn-on/off times of the IGBT 2 is reduced by shifting the on/off timings of the first to fourth semiconductor switch elements Q1, Q2, Q3, Q4 therebetween. However, in the case of shifting the on/off timings of the first to fourth semiconductor switch elements Q2, Q2, Q3, Q4 therebetween, there arises the new problem that the configuration of the control circuit 5 becomes complicated. Further, in the case of forming the drive circuit 1 as an integrated circuit, the gate resistor RG having a larger element area that the first to fourth semiconductor switch elements Q1, Q2, Q3, Q4 is required, and thus there also arises the defect that the entire circuit area of the drive circuit 1 becomes large.

The present invention has been made in view of the above circumstances, and an object thereof is to provide a drive circuit for a power element which is suitable for forming as an integrated circuit, has a simple configuration, and can reduce a switching loss at the turn-off time of a power element which is, for example, an IGBT without using the gate resistor described above.

Means for Solving the Problem

A drive circuit for a power element according to an embodiment of the present invention is configured to turn on/off the power element, for example, and IGBT or an N-type power MOS-FET which is configured to control a main current flow between a first main electrode and a second main electrode in response to a drive signal applied to a control electrode.

The drive circuit for the power element according to the present invention includes:

first and second semiconductor switch elements which are connected in series and interposed between a power supply terminal and a ground terminal, wherein a series connection point of the first and second semiconductor switch elements is connected to the control electrode of the power element;

third and fourth semiconductor switch elements which are connected in series and interposed between the power supply terminal and the ground terminal, wherein a series connection point of the third and fourth semiconductor switch elements is connected to the second main electrode of the power element; and a control circuit which is configured to control turn-on/off of the power element by turning on/off the first to fourth semiconductor switch elements in association with one another in response to a control signal.

In the above drive circuit for the power element, an element having a larger on-resistance than the second to fourth semiconductor switch elements is used as the first semiconductor switch element which is connected on a side of the power supply terminal.

The power element may include an IGBT which includes the control electrode as a gate, the first main electrode as a collector, and the second main electrode as an emitter. Alternatively, the power element may include an N-type power MOS-FET which includes the control electrode as a gate, the first main electrode as a source, and the second main electrode as a drain. Each of the first to fourth semiconductor switch elements includes an MOS-FET which is configured to be turned on/off in response to a voltage applied to a gate thereof from the control circuit.

In the above drive circuit, in an normal operation for turning the power element on/off, the control circuit may be configured to turn the power element on by turning on each of the first and fourth semiconductor switch elements and turning off each of the second and third semiconductor switch elements, and further, configured to turn the power element off by turning off each of the first and fourth semiconductor switch elements and turning on each of the second and third semiconductor switch elements.

At the time of short-circuit interruption in which the power element is forcibly turned off, the control circuit may be configured to turn on each of the first and third semiconductor switch elements and turn off each of the second and fourth semiconductor switch elements. Alternatively, at the time of the short-circuit interruption in which the power element is forcibly turned off, the control circuit may be configured to turn on each of the second and fourth semiconductor switch elements and turn off each of the first and third semiconductor switch elements.

Effects of Invention

According to an embodiment of the present invention, for example, by merely using, as the first semiconductor switch element, a MOS-FET having a narrower channel width than the second to fourth semiconductor switch elements which are realized as MOS-FETs having the same specifications, the drive circuit for the power element in which the first semiconductor switch element has a larger on-resistance than each of the second to fourth semiconductor switch elements can be achieved simply at a low cost.

According to the drive circuit for the power element configured in this manner, when the first semiconductor switch element is turned on and the second semiconductor switch element is turned off so as to turn the power element (IGBT) on, the gate capacitor of the power element (IGBT) is charged via the first semiconductor switch element having the large on-resistance. In contrast, when the first semiconductor switch element is turned off and the second semiconductor switch element is turned on so as to turn the power element (IGBT) off, the gate capacitor of the power element (IGBT) is discharge via the second semiconductor switch element having the small on-resistance.

As a result, the gate resistor in the drive circuit of the related art shown in FIG. 6 is not used, and so a switching loss of the power element at the turn-off time of the power element (IGBT) can be reduced. Further, the element area of the first semiconductor switch element is downsized by the reduction of the on-resistance of the first semiconductor switch element and further the gate resistor is omitted, whereby the drive circuit can be entirely made compact. Moreover, such a practically significant benefit is attained that the circuit configuration itself can be simplified and so the manufacturing cost thereof can be reduced.

DETAILED DESCRIPTION OF EMBODIMENTS

Hereinafter a drive circuit 10 for a power element according to an embodiment of the present invention will be explained with reference to drawings.

Figure 1:
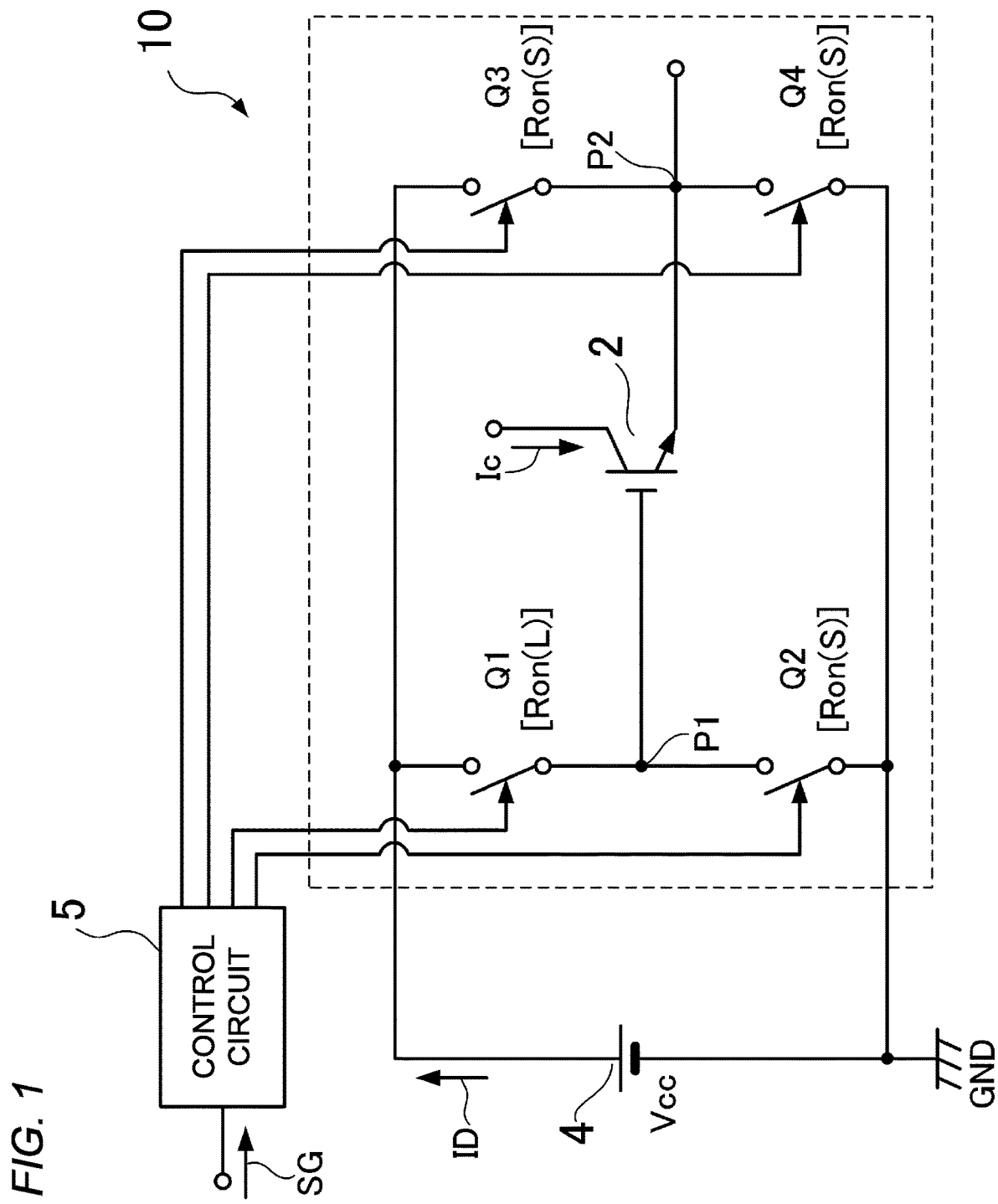
FIG. 1 is a schematic configuration diagram showing the general outline of a drive circuit for a power element according to an embodiment of the present invention.
Figure 6:
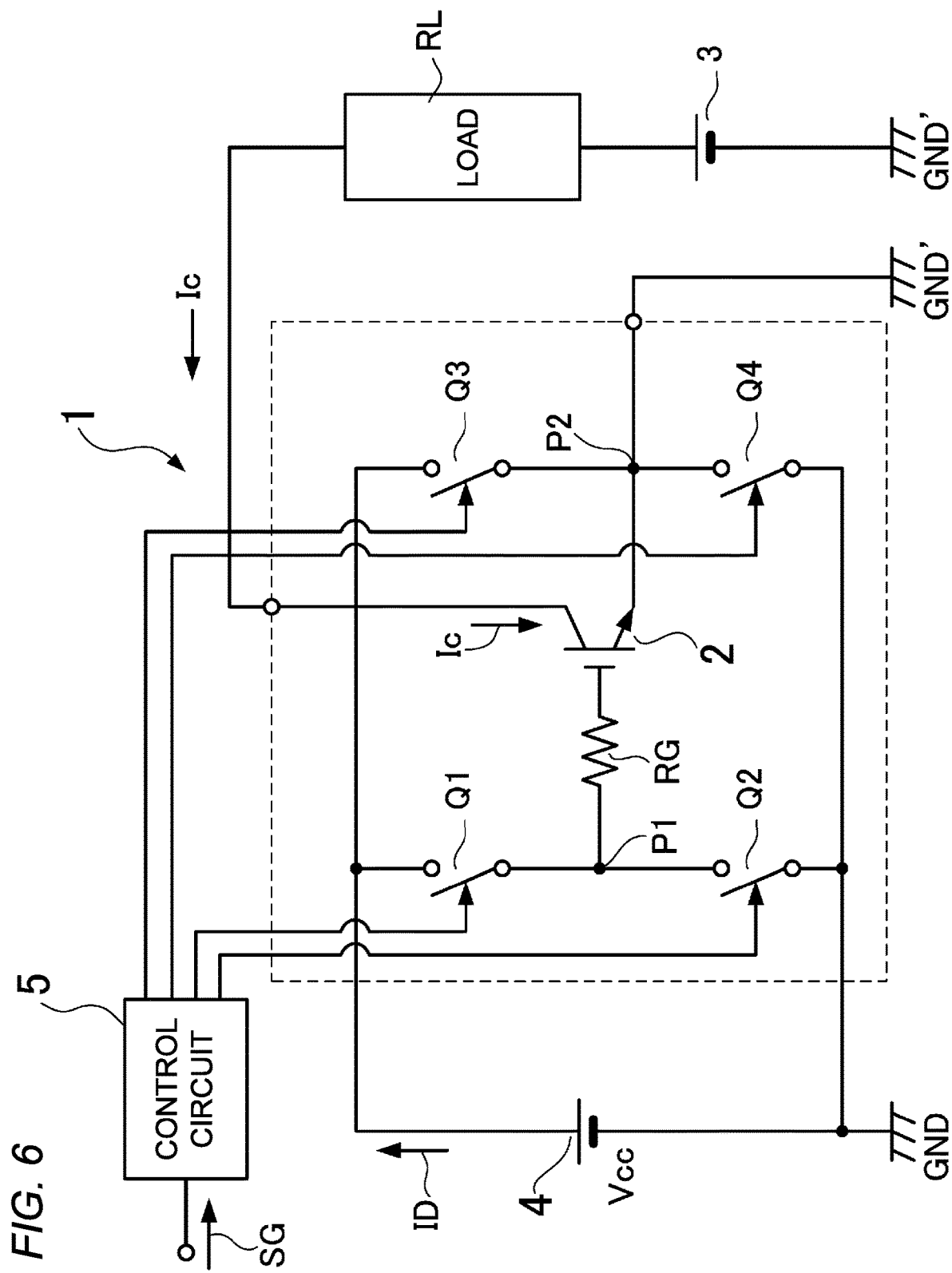
FIG. 6 is a schematic configuration diagram showing an example of a drive circuit for a power element of a related art.
Figure 7:
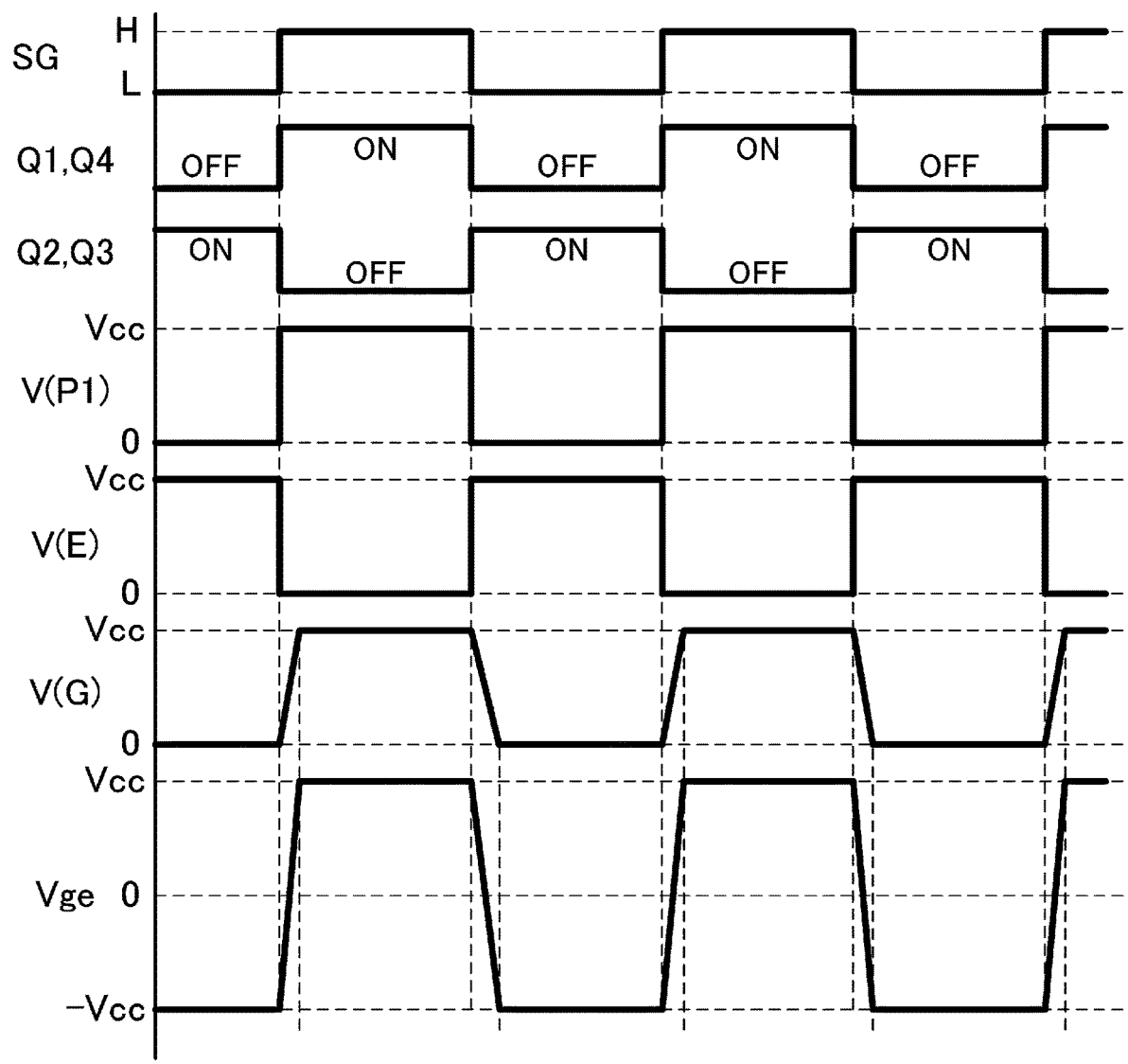
FIG. 7 is a timing chart showing turn-on/off states of a power element by the drive circuit for the power element of the related art.

FIG. 1 is a schematic configuration diagram showing the general outline of the drive circuit 10 for the power element according to the embodiment of the present invention. In the figure, portions identical to those of the drive circuit 1 of the related art shown in FIG. 6 are referred to by the common symbols.

The drive circuit 10 includes first and second semiconductor switch elements Q1, Q2 which are connected in series, interposed between a power supply terminal (Vcc) and a ground terminal (GND), and have a series connection point (node P1) which is connected to the gate of an IGBT 2. Further, the drive circuit 10 includes third and fourth semiconductor switch elements Q3, Q4 which are connected in series, interposed between the power supply terminal (Vcc) and the ground terminal (GND), and have a series connection point (node P2) which is connected to the emitter of the IGBT 2.

The first to fourth semiconductor switch elements Q1, Q2, Q3, Q4 are each formed of, for example, a MOS-FET. In particular, a MOS-FET having a larger on-resistance (conduction resistance) Ron than the second to fourth semiconductor switch elements Q2, Q3, Q4 is used as the first semiconductor switch element Q1 of the first to fourth semiconductor switch elements Q1, Q2, Q3, Q4.

A series circuit formed of the first and second semiconductor switch elements Q1, Q2 and a series circuit formed of the third and fourth semiconductor switch elements Q3, Q4 are provided in parallel between the power supply terminal (Vcc) and the ground terminal (GND), and thus constitute a switch matrix circuit. The switch matrix circuit turns the IGBT 2 on/off the first to fourth semiconductor switch elements Q1, Q2, Q3, Q4 in association with one another under the control of a control circuit 5.

That is, the feature of the drive circuit 10 according to the present invention is that an element having a larger on-resistance than the second to fourth semiconductor switch elements Q2, Q3, Q4 is used as the first semiconductor switch element Q1 constituting the switch matrix circuit, and the gate resistor RG in the drive circuit 1 of the related art shown in FIG. 6 is omitted. In other words, the feature of the configuration of the drive circuit is that a voltage of the node P1 of the first and second semiconductor switch elements Q1, Q2 connected in series is directly applied to the gate of the IGBT 2 without passing through the gate resistor RG.

Figure 2:
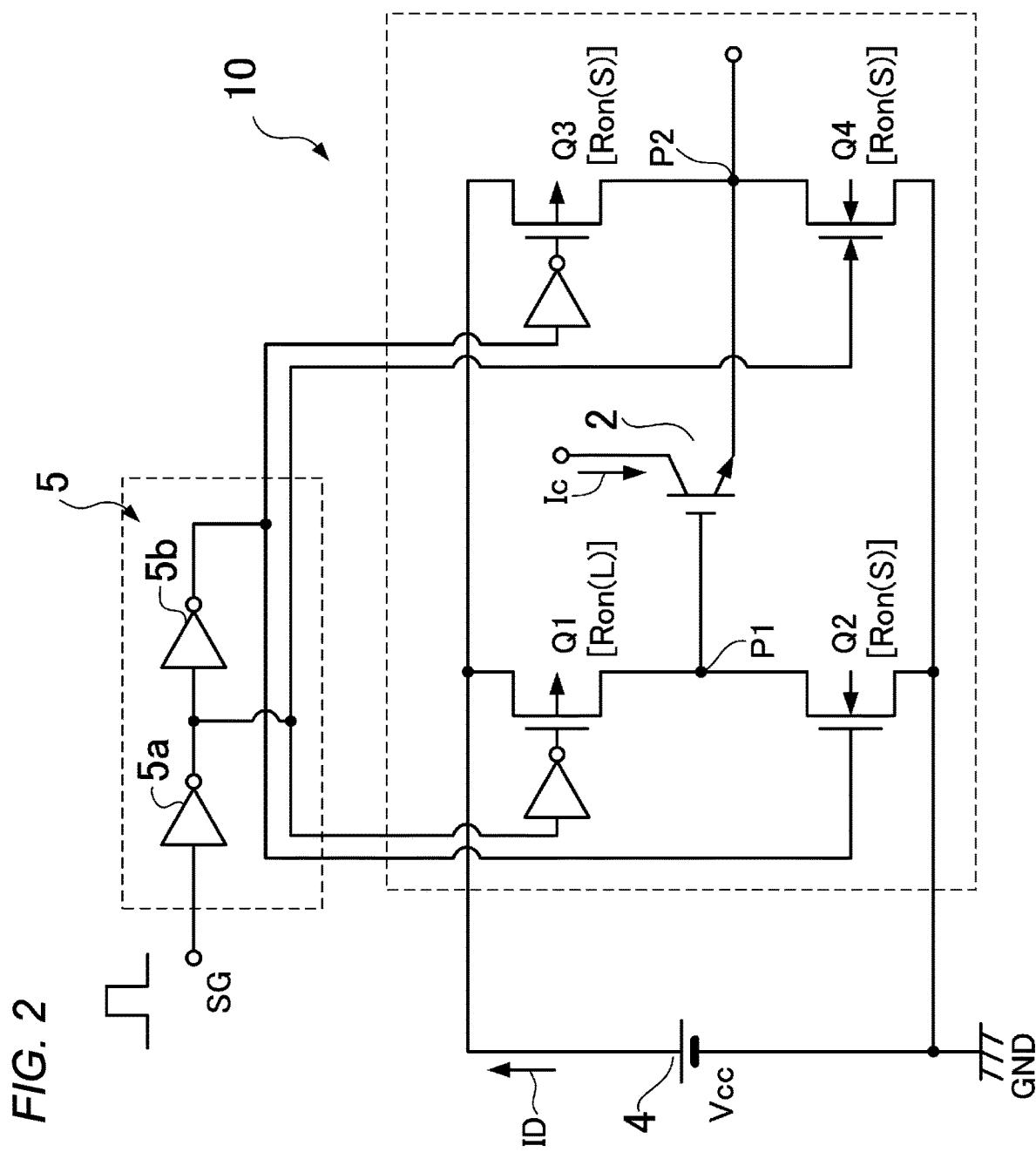
FIG. 2 is a diagram showing the concrete configuration example to the drive circuit shown in FIG. 1.

Specifically, for example, as shown in FIG. 2, a MOS-FET having a large on-resistance Ron is used as the first semiconductor switch element Q1. A MOS-FET having a small on-resistance Ron is used as each of the second to fourth semiconductor switch elements Q2, Q3, Q4. Here, an on-resistance of the first semiconductor switch element Q1 is denoted by Ron(L) and an on-resistance of each of the second to fourth semiconductor switch elements Q2, Q3, Q4 is denoted by Ron(S) [<Ron(L)].

Incidentally, the first to fourth semiconductor switch elements Q1, Q2, Q3, Q4 are formed of respective switching MOS-FETs basically having the same switching characteristic, the same current capacity, and the same withstand voltage. However, in particular, the first semiconductor switch element Q1 having the large on-resistance Ron is realized, for example, as a MOS-FET having a narrower channel width than the second to fourth semiconductor switch elements Q2, Q3, Q4.

Basically in an normal operation for turning the IGBT 2 on/off, the drive circuit 10 configured in this manner turns the IGBT 2 on by turning on each of the first and fourth semiconductor switch elements Q1, Q4, and turning off each of the second and third semiconductor switch elements Q2, Q3. Further, the drive circuit turns the IGBT 2 off by turning off each of the first and fourth semiconductor switch elements Q1, Q4, and turning on each of the second and third semiconductor switch elements Q2, Q3.

The control circuit 5 which turns on/off the first to fourth semiconductor switch elements Q1, Q2, Q3, Q4 in association with one another in this manner is configured as shown in, for example, FIG. 2. Specifically, the control circuit 5 includes a first inverter circuit 5a which inverts a control signal SG, thereby generating a drive signal for turning on/off the first and fourth semiconductor switch elements Q1, Q4. The drive signal outputted form the first inverter circuit 5a takes two values, that is, a power supply voltage Vcc of the power supply 4 or a ground voltage (0 V) so as to turn on/off the first and fourth semiconductor switch elements Q1, Q4 in an opposite manner.

The control circuit 5 further includes a second inverter circuit 5b which inverts the output of the first inverter circuit 5a, thereby generating a drive signal for turning on/off the second and third semiconductor switch elements Q2, Q3. The drive signal outputted from the second inverter circuit 5b also takes two values of the power supply voltage Vcc of the power supply 4 or the ground voltage (0 V).

According to the drive circuit 10 configured in this manner, the first and second semiconductor switch elements Q1, Q2 connected in series are turned on/off in an opposite manner by receiving the outputs from the first and second inverter circuits 5a, 5b. The third and fourth semiconductor switch elements Q3, Q4 connected in series are also turned on/off in an opposite manner by receiving the outputs from the first and second inverter circuits 5a, 5b. In particular, the third and fourth semiconductor switch elements Q3, Q4 are turned on/off in a complimentary manner with the on/off of the first and second semiconductor switch elements Q1, Q2. The control circuit 5 performs the on/off semiconductor switch elements Q1, Q2. The control circuit 5 performs the on/off control of the IGBT 2 by performing the on/off control of the first to fourth semiconductor switch elements Q1, Q2, Q3, Q4 in association with one another, whereby the IGBT 2 is turned on and off.

As described above, according to the first to fourth semiconductor switch elements Q1, Q2, Q3, Q4 which are turned on/off under the control of the control circuit 5, when the first semiconductor switch element Q1 is turned on and the second semiconductor switch element Q2 is turned off, the voltage V(P1) of the node P1 increases accordingly. In this case, the third semiconductor switch element Q3 is turned off and the fourth semiconductor switch element Q4 is turned on, and thus the emitter voltage V(E) of the IGBT 2 is set to the ground voltage (0 V) accordingly.

The current is caused to flow into the gate of the IGBT 2 via the on resistor Ron(L) of the first semiconductor switch element Q1, thereby charging the gate capacitor of the IGBT 2. The voltage applied to the gate of the IGBT 2 increases in accordance with the charging to the gate capacitor of the IGBT 2. When the gate voltage exceeds a threshold voltage of the IGBT 2, the IGBT 2 is turned on accordingly.

On the other hand, when the first semiconductor switch element Q1 is turned off and the second semiconductor switch element Q2 is turned on, the voltage V(P1) of the node P1 is set to the ground voltage (0 V). At that time, the third semiconductor switch element Q3 is turned on and the fourth semiconductor switch element Q4 is turned off, and so the emitter voltage V(E) of the IGBT 2 is set to the power supply voltage Vcc accordingly. As a result, a gate emitter voltage V(ge) of the IGBT 2 instantaneously becomes negative (−Vcc) and thus the IGBT 2 is turned off.

Further, at this time, electric charge accumulated in the gate capacitor of the IGBT 2 is discharge via the second semiconductor switch element Q2. Then, the voltage applied to the gate of the IGBT 2 is restored to the ground voltage (0 V) in accordance with the discharge of the gate capacitor of the IGBT 2. Thereafter, the voltage (0 V) of the node P1, which is determined by the first semiconductor switch element Q1 is an off state and the second semiconductor switch element Q2 is an on state, is applied to the gate of the IGBT 2. The IGBT 2 thus maintains an off state.

According to the drive circuit 10 configured in the above described manner, at the time of turning the IGBT 2 on in the normal operation, the gate capacitor of the IGBT 2 can be charged via the first semiconductor switch element Q1 having the larger on-resistance Ron. At the time of turning the IGBT 2 off, the gate capacitor of the IGBT 2 can be discharged instantaneously via the second semiconductor switch element Q2 having the small on-resistance Ron. That is, the turn-on of the IGBT 2 can be delayed by the time necessary for charging the gate capacitor of the IGBT 2, and the gate capacitor of the IGBT 2 can be discharged instantaneously. As a consequence, the gate resistor is not used, and thus a switching loss at the turn-off time of the IGBT 2 can be reduced to a large extent correspondingly.

When short-circuit is detected on a load side to which a current Ic is supplied via the IGBT 2, the IGBT 2 is forcibly turned off, whereby the IGBT 2 and the load (RL) are each protected from an excessive short-circuit current and further the drive circuit 10 are also protected.

The protection operation for the IGBT 2 by the short-circuit interruption is achieved, for example, by turning on each of the first and third semiconductor switch elements Q1, Q3, and turning off each of the second and fourth semiconductor switch elements Q2, Q4. Specifically, in the case of forcibly turning on each of the first and third semiconductor switch elements Q1, Q3 at the time of detecting the short-circuit interruption, it is only required to constitute the control circuit 5 as shown in, for example, FIG. 3 as to switch respective on/off signals supplied as the first to fourth semiconductor switch elements Q1, Q2, Q3, Q4 in accordance with a short-circuit detection signal CO.

Figure 3:
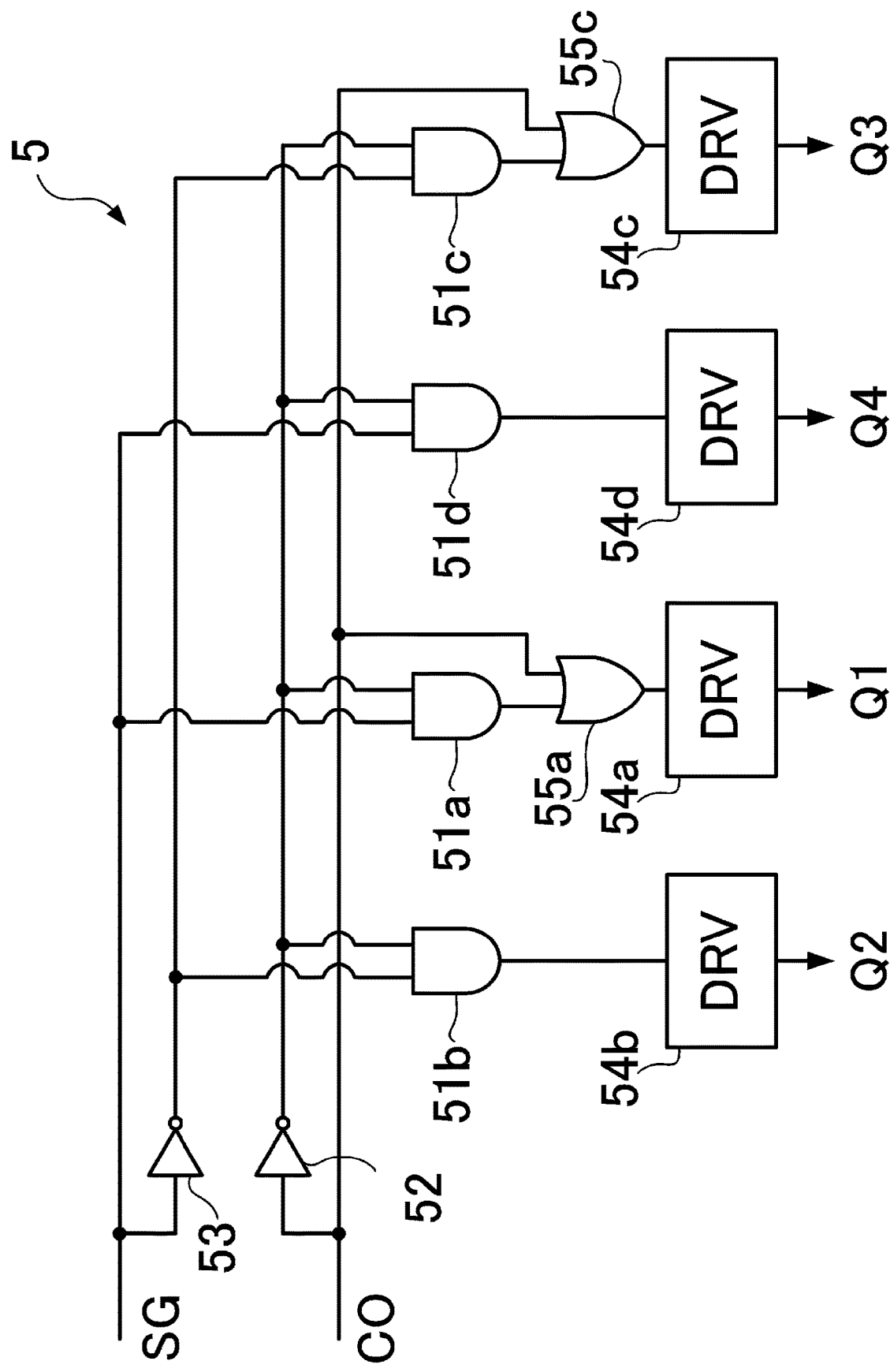
FIG. 3 is a diagram showing another configuration example of a control circuit in the drive circuit shown in FIG. 2.

The control circuit 5 shown in FIG. 3 includes four AND circuits 51*a*, 51*b*, 51*c*, 51*d* of which gates are each opened in accordance with the short-circuit detection signal CO. The AND circuits 51*a*, 51*b*, 51*c*, 51*d* are each opened via an inverter circuit 52 when the short-circuit detection signal CO is not supplied, in other words, when the short-circuit detection signal CO is at a low level (L) and when the IGBT 2 is to be normally operated. The AND circuits 51*a*, 51*b*, 51*c*, 51*d* supply the control signals SC or signals, which are obtained by inverting the control signals SG via an inverter circuit 53, to drive circuits 54*a*, 54*b*, 54*c*, 54*d*, respectively. The drive circuits 53*a*, 53*b*, 53*c*, 53*d* generate output voltages necessary for turning on/off the first to fourth semiconductor switch elements Q1, Q2, Q3, Q4, respectively.

In contrast, the AND circuits 51*a*, 51*b*, 51*c*, 51*d* are each closed when the short-circuit detection signal CO is supplied thereto, in other words, when the short-circuit detection signal CO becomes a high level (H). In this case, the short-circuit detection signal CO is supplied to the drive circuits 54*a*, 54*c* via respective OR circuits 55*a*, 55*c*. And, the short-circuit detection signal CO, which is inverted via the inverter circuit 52, is supplies to the drive circuits 54*b*, 54*d* via the respective AND circuits 51*b*, 51*d*.

Thus, when the short-circuit detection signal CO is supplied, the first and third semiconductor switch elements Q1, Q3 are each forcibly turned on, and concurrently, the second and fourth semiconductor switch elements Q2, Q4 are each forcibly turned off. As a result, the gate voltage V(G) of the IGBT 2 is set to the power supply voltage Vcc, and the emitter voltage V(E) of the IGBT 2 is also set to the power supply voltage Vcc. Then, the gate emitter voltage V(ge) of the IGBT 2 is forcibly set to 0 V and thus the IGBT 2 is forcibly set to an off state. The current Ic flows into the load (RL) is interrupted n association with the forcible turning-off of the IGBT 2, and so the IGBT 2, etc. are protected from an overcurrent caused by the load short-circuit.

According to the drive circuit 10 configure din this matter, it is only required to turn on each of the first and third semiconductor switch elements Q1, Q3 and thus set the voltage applied to each of the gate and the emitter of the IGBT 2 to the power supply voltage Vcc. In this case, during a time period required to charging the gate capacitor of the IGBT 2, the gate emitter voltage V(ge) of the IGBT 2 is a negative voltage and so the IGBT 2 is turned off. Accompanied with the turning-off of the IGBT 2, the gate capacitor of the IGBT 2 is discharged via the first semiconductor switch element Q1. Consequently, the gate emitter voltage V(ge) of the IGBT 2 is kept at 0 V, and thus the IGBT 2 maintains an off state.

Thus, even in the case of forcibly turning on each of the first and third semiconductor switch elements Q1, Q3 at the time of detecting the short-circuit interruption, unlike the related art, the charging/discharging of the gate capacitor of the IGBT 2 is not performed via the gate resistor RG. Accordingly, a switching loss at the turn-off time of the IGBT 2 can be reduced. Consequently, a consumption power of the drive circuit 10 can be reduced.

Incidentally, in the short-circuit interruption, each of the second and fourth semiconductor switch elements Q2, Q4 can be forcibly turned on in place of the forcible turning-on of each of the first and third semiconductor switch elements Q1, Q3. In this case, it is indisputable that each of the first and third semiconductor switch elements Q1, Q3 is forcibly turned off in conjunction with the forcible turning-on of each of the second and fourth semiconductor switch elements Q2, Q4.

In this manner, when the first and third semiconductor switch elements Q1, Q3 are each turned off, and simultaneously, the second and fourth semiconductor switch elements Q2, Q4 are each turned on, the gate voltage V(G) of the IGBT 2 is set to the ground voltage (0 V) and, the emitter voltage V(E) of the IGBT 2 is also set to the ground voltage (0 V). As a result, the gate emitter voltage V(ge) of the IGBT 2 becomes 0 V, and thus the IGBT 2 is forcibly turned off. The current Ic flows into the load (RL) is interrupted in association with the forcible turning-off of the IGBT 2, whereby the IGBT 2, etc. are protected from an overcurrent caused by the load short-circuit.

Figure 4:
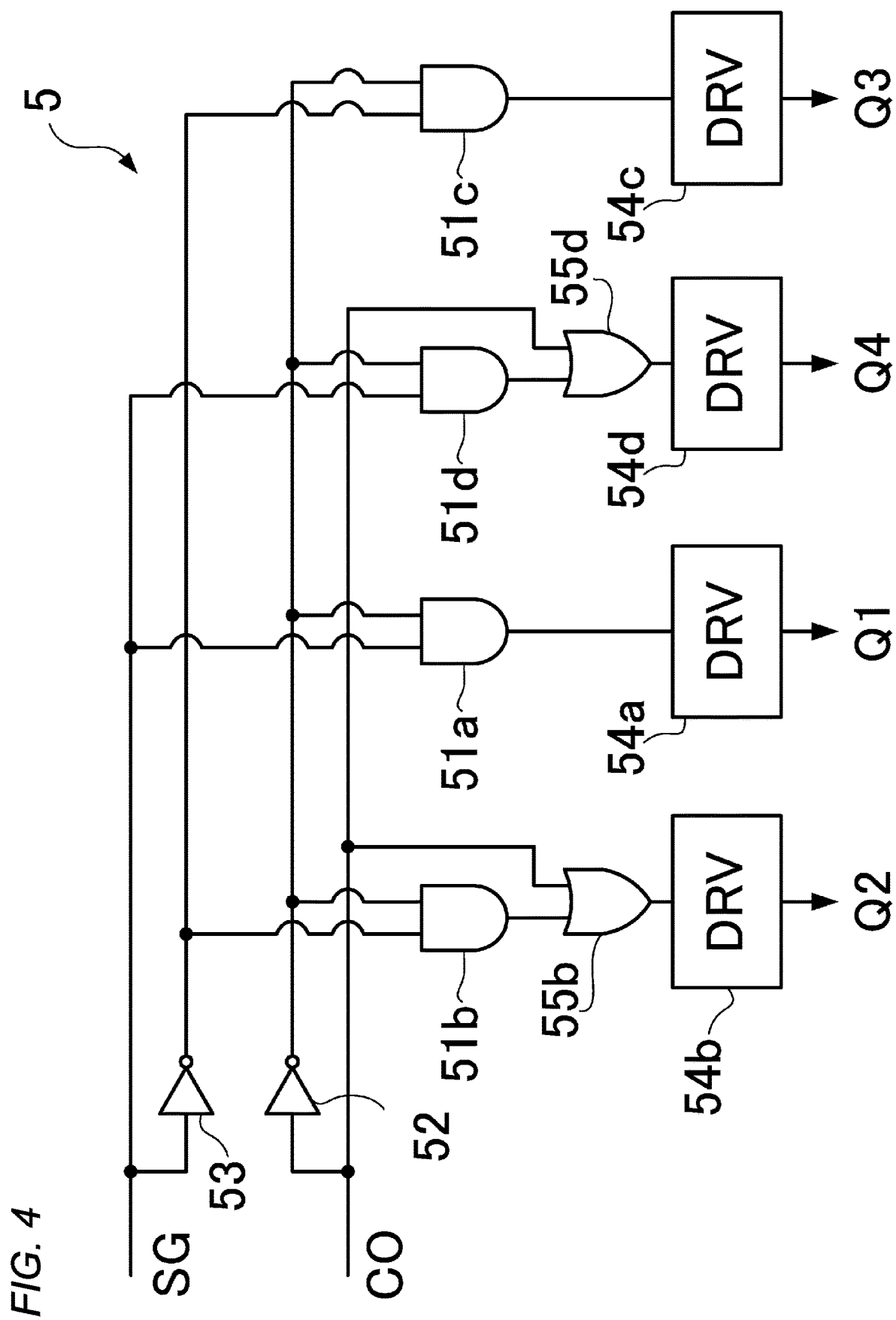
FIG. 4 is a diagram showing still another configuration example of the control circuit in the drive circuit shown in FIG. 2.

Incidentally, in the case or forcibly turning off each of the second and fourth semiconductor switch elements Q2, Q4 as described above when the short-circuit detection signal CO is supplied, it is only required to constitute the control circuit 5 as shown in, for example, FIG. 4. The control circuit 4 shown in FIG. 4 is configured that the short-circuit detection signal CO is supplied to each of the drive circuits 54*a*, 54*c* and that the short-circuit detection signal CO, which is inverted by the inverter circuit 55, is supplied to each of the drive circuits 54*b*, 54*d* using respective OR circuits 55*b*, 55*d* in place of the OR circuits 55*a*, 55*c* described above.

According to the drive circuit 10 configured in this manner, only the second and fourth semiconductor switch elements Q2, Q4 having the small on-resistance Ron are turned on, and thus a switching loss at the turn-off time of the IGBT 2 can be further reduced. The charging/discharging of the gate capacitor of the IGBT 2 is not performed via the gate resistor RG, a power consumption of the drive circuit 10 can be reduced correspondingly.

Further, the gate resistor RG used in the control circuit 1 of the related art is eliminated, and so the first semiconductor switch element Q1 can be downsized. Thus, when forming the drive circuit 10 as an integrated circuit, a chip area thereof can be reduced. Further, the gate resistor RG is not required to be formed side by side with the MOS-FET, etc. on a semiconductor chip, and thus such an effect can be attained that a manufacturing cost of the drive circuit can be suppressed low.

Figure 5:
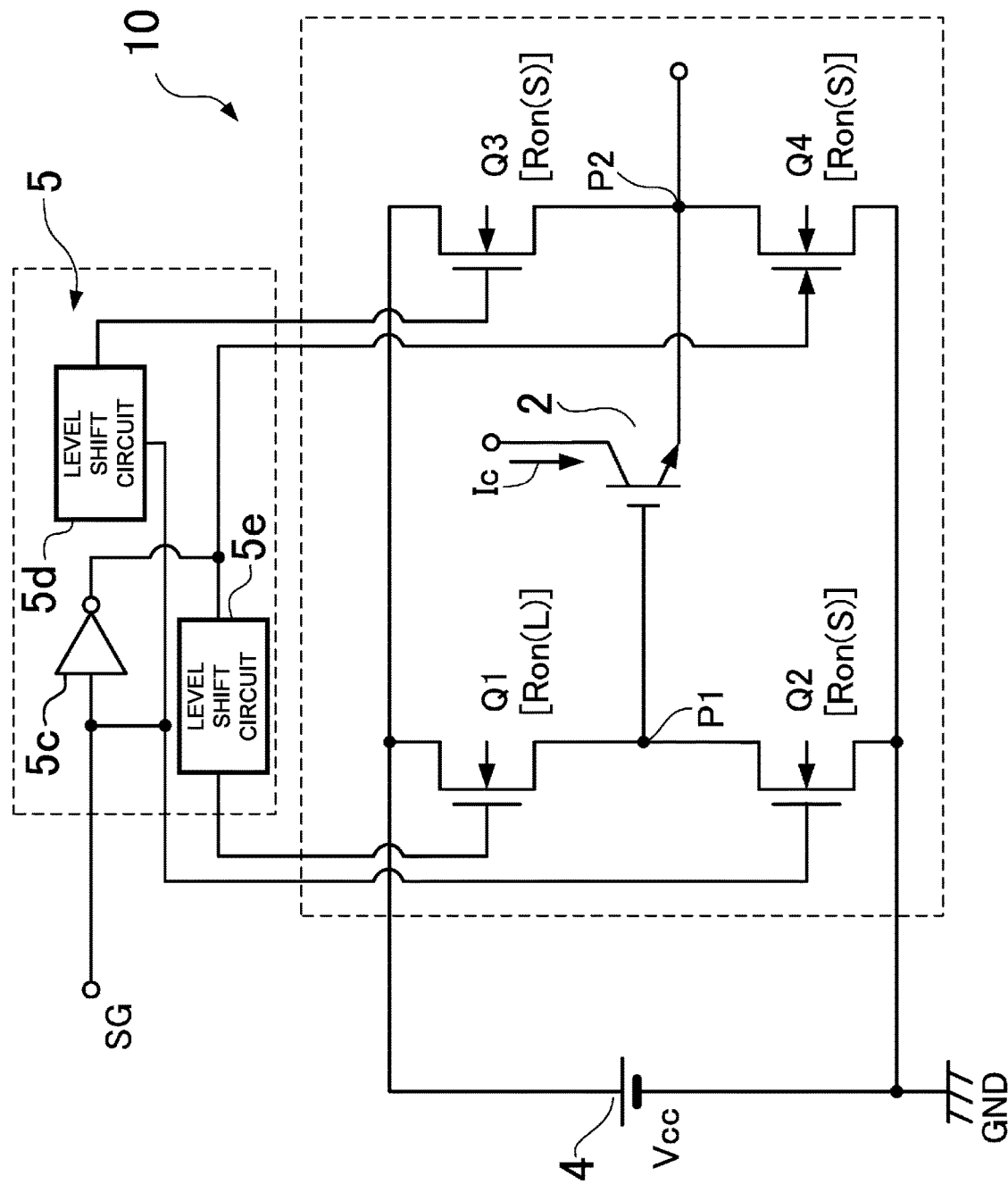
FIG. 5 is a diagram showing another concrete configuration example of the drive circuit shown in FIG. 1.

In the above-described explanation, the example is shown in which a P-type MOS-FET is used as each of the first and third semiconductor switch elements Q1, Q3 and an N-type MOS-FET is used as each of the second and fourth semiconductor switch elements Q2, Q4. As shown in FIG. 5 by way of example, however, the switch matrix circuit can be configured using an N-type MOS-FET as each of the first to fourth semiconductor switch elements Q1, Q2, Q3, Q4. In this case, it is also indisputable that the MOS-FET having a larger on-resistance Ron than the second to fourth semiconductor switch elements Q2, Q3, Q4 is used as the first semiconductor switch element Q1.

In this case, a turning-on operating condition of the first and third semiconductor switch elements Q1, Q3 formed of the N-type MOS-FETs differs from the turning-on operating condition of the first and third semiconductor switch elements Q1, Q3 formed of the P-type MOS-FETs in the drive circuit 10 shown in FIG. 2. That is, the first and third semiconductor switch elements Q1, Q3 turn on/off in accordance with the voltages of the respective nodes P1, P2, as reference voltages, which change in accordance with the turning-on/off of the first to fourth semiconductor switch elements Q1, Q2, Q3, Q4.

Thus, in this case, as shown in FIG. 5, the control circuit 5 is only required to be configured that the input and output of an inverter circuit 5c, which inverts the control signal SG, are supplied to the gates of the third and first semiconductor switch elements Q3, Q1 via level shift circuits 5d, 5e, respectively. Also in the drive circuit 10 in which the switch matrix circuit is configured using the N-type MOS-FET as each of the first to fourth semiconductor switch elements Q1, Q2, Q3, Q4 in this manner, the voltage of the node P1 as the series connection point of the first and second semiconductor switch elements Q1, Q2 is directly applied to the gate of the IGBT 2. Thus, effects similar to that of the above-described embodiment can be attained.

Incidentally, the present invention is not limited to the above-described embodiments. For example, although not illustrated in particular, it is of course possible to use a P-type MOS-FET as each of the first to fourth semiconductor switch elements Q1, Q2, Q3, Q4. Alternatively, it is of course possible to use an N-type MOD-FET as each of the first and second semiconductor switch elements Q1, Q2 and a P-type MOS-FET as each of the third and fourth semiconductor switch elements Q3, Q4.

It is sufficient that the on-resistance Ron of the first semiconductor switch element Q1 is set as a value which can change the gate capacitor of the IGBT 2 over the time period necessary for surely turning the IGBT 2 on. Further, as described above, the present invention can also be applied to the case of driving a power MOS-FET as the power element. Moreover, it is indisputable that a bipolar transistor may be used as each of the first to fourth semiconductor switch elements Q1, Q2, Q3, Q4.

The configuration of the control circuit 5 can be changed in various manners according to the configuration of the switch matrix circuit, and the turn-on/off states, etc. of the first to fourth semiconductor switch elements Q1, Q2, Q3, Q4 constituting the switch matrix circuit. The present invention can be implemented in such a way as to be changed in various manners in a range not departing from the gist of the present invention.

REFERENCE SIGNS LIST 1, 10 drive circuit
2 power element (IGBT)
3 main power supply
4 power supply (Vcc)
5 control circuit (CONT)
Q1 first switch element (MOS-FET)
Q2 second switch element (MOS-FET)
Q3 third switch element (MOS-FET)
Q3 fourth switch element (MOS-FET)
RG gate resistor

The invention claimed is:

1. A drive circuit for turning on/off a power element which is configured to control a main current flow between a first main electrode and a second main electrode in response to a drive signal applied to a control electrode, the drive circuit comprising:
first and second semiconductor switch elements which are connected in series and interposed between a power supply terminal and a ground terminal, wherein a series connection point of the first and second semiconductor switch elements is connected to the control electrode of the power element;
third and fourth semiconductor switch elements which are connected in series and interposed between the power supply terminal and the ground terminal, wherein a series connection point of the third and fourth semiconductor switch elements is connected to the second main electrode of the power element; and
a control circuit which is configured to control turn-on/off of the power element by turning on/off the first to fourth semiconductor switch elements in association with one another in response to a control signal,
wherein an element having a larger on-resistance than the second to fourth semiconductor switch elements is used as the first semiconductor switch element which is connected on a side of the power supply terminal.

2. The drive circuit according to claim 1,
wherein the power element includes an IGBT which includes the control electrode as a gate, the first main electrode as a collector and the second main electrode as an emitter, and
wherein each of the first to fourth semiconductor switch elements includes an MOS-FET which is configured to be turned on/off in response to a voltage applied to a gate thereof from the control circuit.

3. The drive circuit according to claim 1,
wherein the power element includes an N-type power MOS-FET which includes the control electrode as a gate, the first main electrode as a source and the second main electrode as a drain, and
wherein each of the first to fourth semiconductor switch elements includes an MOS-FET which is configured to be turned on/off in response to a voltage applied to a gate thereof from the control circuit.

4. The drive circuit according to claim 1,
wherein in an normal operation for turning the power element on/off, the control circuit is configured to:
turn the power element on by turning on each of the first and fourth semiconductor switch elements, and turning off each of the second and third semiconductor switch elements, and
turn the power element off by turning off each of the first and fourth semiconductor switch elements, and turning on each of the second and third semiconductor switch elements.

5. The drive circuit according to claim 1,
wherein at a time of short-circuit interruption in which the power element is forcibly turned off, the control circuit is configured to:

turn on each of the first and third semiconductor switch elements, and turn off each of the second and fourth semiconductor switch elements.

6. The drive circuit according to claim 1, wherein at a time of short-circuit interruption in which the power element is forcibly turned off, the control circuit is configured to:
turn on each of the second and fourth semiconductor switch elements, and turn off each of the first and third semiconductor switch elements.

7. The drive circuit according to claim 1, wherein
the power element includes an IGBT which includes the control electrode as a gate, the first main electrode as a collector and the second main electrode as an emitter, and
a resistor is not disposed between the series connection point of the first and second semiconductor switch elements and the gate of the IGBT.

8. The drive circuit according to claim 1, wherein
each of the first to fourth semiconductor switch elements includes an MOS-FET which is configured to be turned on/off in response to a voltage applied to a gate thereof from the control circuit, and
a channel width of the MOS-FET of the first semiconductor switch element is narrower than a respective channel width of the MOS-FET of each of the second to fourth semiconductor switch elements.

9. The drive circuit according to claim 1, wherein
the power element includes an IGBT which includes the control electrode as a gate, and
a voltage at the series connection point of the first and second semiconductor switch elements is directly applied to the gate of the IGBT without passing through a gate resistor.

* * * * *

UNITED STATES PATENT AND TRADEMARK OFFICE
CERTIFICATE OF CORRECTION

PATENT NO. : 10,911,030 B2
APPLICATION NO. : 16/119290
DATED : February 2, 2021
INVENTOR(S) : Hidetomo Ohashi It is certified that error appears in the above-identified patent and that said Letters Patent is hereby corrected as shown below:

In the Specification

Column 1, Line 9 (approx.):
Delete "2016-1765892" and insert -- 2016-176892 --, therefor.

Signed and Sealed this
Sixth Day of July, 2021

Drew Hirshfeld
*Performing the Functions and Duties of the
Under Secretary of Commerce for Intellectual Property and
Director of the United States Patent and Trademark Office*